United States Patent [19]

Kim et al.

[11] Patent Number: 5,338,981
[45] Date of Patent: Aug. 16, 1994

[54] SEMICONDUCTOR DEVICE HAVING A DECODING CIRCUIT FOR SELECTION CHIPS

[75] Inventors: Ki-Hong Kim; Chang-Seok Lee; Hyung-Moo Park; Hyung-Jin Yoon; Sin-Chong Park, all of Daejeon-shi, Rep. of Korea

[73] Assignee: Electronics and Telecommunications Research Institute, Daejeon-shi, Rep. of Korea

[21] Appl. No.: 940,214

[22] Filed: Sep. 8, 1992

[30] Foreign Application Priority Data

Sep. 7, 1991 [KR] Rep. of Korea .................. 91-15639

[51] Int. Cl.$^5$ ............................................. G11C 8/00
[52] U.S. Cl. .................................. 307/463; 307/465; 307/443; 307/296.1
[58] Field of Search ............... 307/463, 473, 465, 443, 307/296.1

[56] References Cited

U.S. PATENT DOCUMENTS

| | | | |
|---|---|---|---|
| 4,128,879 | 12/1978 | Gardner | 307/463 |
| 4,721,868 | 1/1988 | Cornell et al. | 307/463 |
| 4,760,291 | 7/1988 | Nakajima et al. | |
| 4,798,977 | 1/1989 | Sakui et al. | 307/463 |
| 4,811,201 | 3/1989 | Rau et al. | 395/325 |
| 4,910,646 | 3/1990 | Kiuchi et al. | 307/463 |

Primary Examiner—Edward P. Westin
Assistant Examiner—Jon Santamauro
Attorney, Agent, or Firm—Lowe, Price, LeBlanc & Becker

[57] ABSTRACT

There is disclosed a semiconductor device having a plurality of chips in which a predetermined extended addresses are allocated for each of the chips to select the chips in a multiple-chip module, the device comprising: a plurality of semiconductor chip selectors equipped in said semiconductor device, for supplying an internal chip select signals to select the chips in response to said extended addresses and a module select signal; and each of said semiconductor chip selectors having a plurality of decoders for receiving the extended addresses and outputting a predetermined logic signal, and an AND gate for receiving said module select signal and said logic signal of each of said decoders and outputting said internal chip select signals. Accordingly, in packaging semiconductor chips in accordance with the invention, a semiconductor chip module can be miniatured more, processing steps of such semiconductor chip module can be reduced, and input and output terminals of such semiconductor chip module can be reduces in the number so that the invention can improve access time or delay time in the module.

5 Claims, 4 Drawing Sheets

|   | connection(C) | | no connection(NC) |
|---|---|---|---|
| T | H | L | H or L |
| A | H | L | P |

FIG. 2A
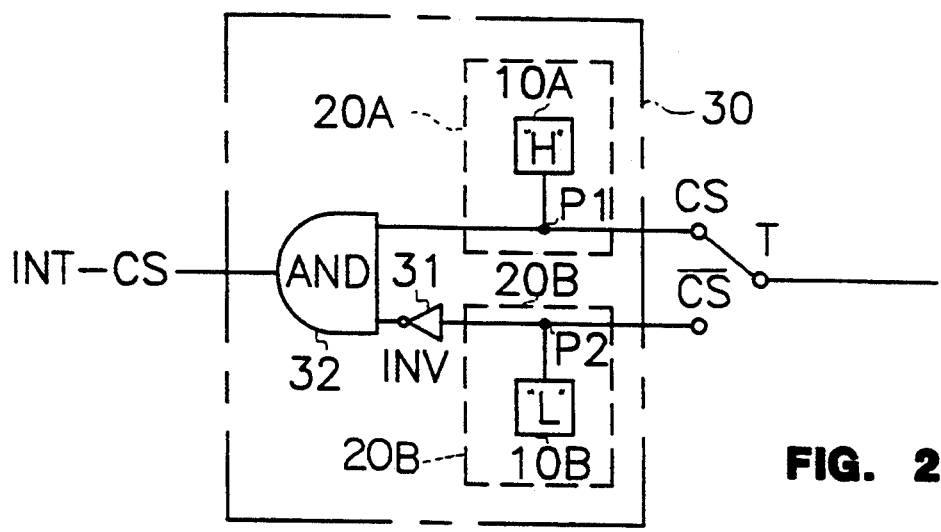
FIG. 2B
FIG. 3A
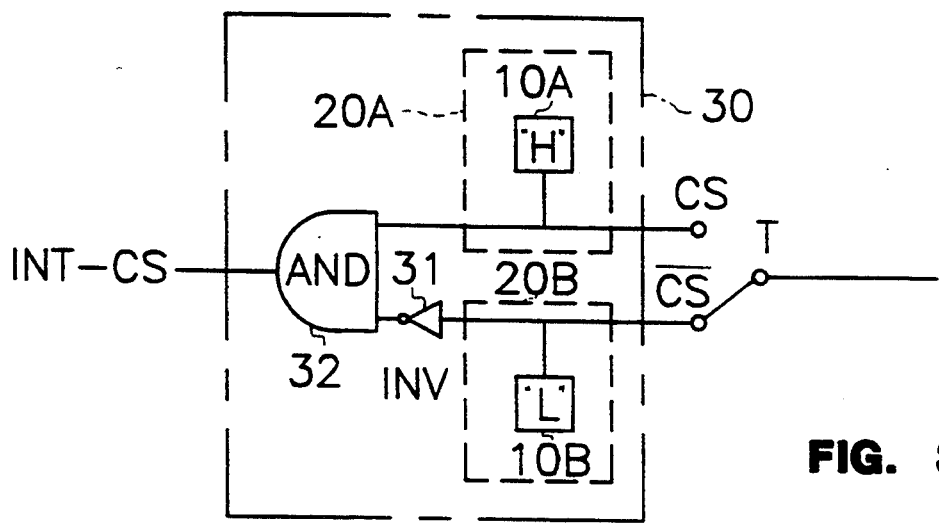
FIG. 3B

| (AX1,AX2) | (0,0) | (1,0) | (0,1) | (1,1) |
|---|---|---|---|---|
| CS1 | NC | C | NC | C |
| $\overline{CS1}$ | C | NC | C | NC |
| CS2 | NC | NC | C | C |
| $\overline{CS2}$ | C | C | NC | NC |

SEMICONDUCTOR DEVICE HAVING A DECODING CIRCUIT FOR SELECTION CHIPS

BACKGROUND OF THE INVENTION

1. Field of the Invention

The present invention relates to a semiconductor device having a pair of chip select terminals, and more particularly to a semiconductor device having a decoding circuit for selecting chips in a multiple-chip module.

2. Description of the Prior Art

Generally, to extend storage capacity in a semiconductor memory device, there are two methods. One is to increase the amount of data (that is, the number of bits in one word) to be inputted and outputted to/from the memory device. The other is to increase the number of addresses in order to designate locations of information to be stored in the memory device.

In the methods, the former requires allocation of one chip select terminal in which respective chip select terminals of memory chips are combined with each other. Because of use of such one chip select terminal, it has been impossible to allocate two chip select terminals in order to select such chips.

The latter requires a plurality of complicated chip selecting circuits such as decoders due to a shared data bus for chip select terminals of memory chips. For example, it is necessary to use decoders corresponding to the number of log N N in order to select chips, when the number of chips is N. Also, since such decoders are respectively located outside semiconductor chips, there is a problem that in packaging semiconductor chips a high-density integration is lowered.

Also, a technique to enable reduction of the number of terminals of a semiconductor device is disclosed in U.S. Pat. No. 4,760,291. Since this technique also requires a delay circuit for selecting chips, processing time to access information in a semiconductor device, such as access time and delay time and so on is delayed.

SUMMARY OF THE INVENTION

It is the object of the present invention to provide a semiconductor device having a pair of chip select terminals in which a decoding circuit having a simple construction for selecting chips can be equipped within each of chips of the semiconductor device.

According to an aspect of the present invention, there is provided a semiconductor device having a plurality of chips in which predetermined extended addresses are allocated for each of the chips to select the chips in a multiple-chip module, the device comprising:
  a plurality of semiconductor chip selectors equipped in said semiconductor device, for supplying internal chip select signals to select the chips in response to said extended addresses and a module select signal; and
  each of said semiconductor chip selectors having a plurality of decoders for receiving the extended addresses and outputting a predetermined logic signal, and an AND gate for receiving said module select signal and said logic signal of each of said decoders and outputting said internal chip select signals.

In the semiconductor device, each of said decoders comprises a plurality of chip select units corresponding to the number of the chips in the multiple-chip module and an AND gate for receiving outputs of said chip select units and outputting said logic signal.

Also, each of said chip select units comprises a pair of chip select terminals for alternatively connecting to an external input terminal, a pair of quasi-tristate input terminals to be respectively connected to said chip select terminals, an inverting gate for inverting a logic level of a first connecting point between one of the chip select terminals and one of a pair of internal predefined logic circuits in one of the quasi-tristate terminals, and an AND gate for receiving signals from the inverting gate and a second connecting point between the other chip select terminal and the other internal predefined logic circuit in the other quasi-tristate terminal and for supplying a predetermined level signal as a logic level of an internal input terminal. Also, each of the chip select units further comprises a module select terminal and each of said internal predefined logic circuits comprises a high resistor.

Further, each logic level in said respective connecting points is determined by a level signal of the external input terminal when said respective chip select units are connected with the external input terminal, and each logic level in said respective connecting points is determined by a logic level held in the chip select units when said respective chip select units are not connected with the external input terminal.

BRIEF DESCRIPTION OF THE DRAWINGS

This invention may be better understood and its numerous objects and advantages will become apparent to those skilled in the art by reference to the accompanying drawings as follows:

FIGS. 2A and 2B are a circuit diagram illustrating a construction of a chip select unit according to the present invention, and a logic table showing logic levels of an external input terminal and a pair chip select terminals in accordance with connection/non-connection therebetween, when one of the chip select terminals is connected with the external input terminal;

FIGS. 3A and 3B are a circuit diagram illustrating a construction of a chip select unit according to the present invention, and a logic table showing logic levels of an external input terminal and a pair chip select terminals in accordance with connection/non-connection therebetween, when the other chip select terminals is connected with the external input terminal;

DESCRIPTION OF THE PREFERRED EMBODIMENT(S)

Figures 1A, 1B:
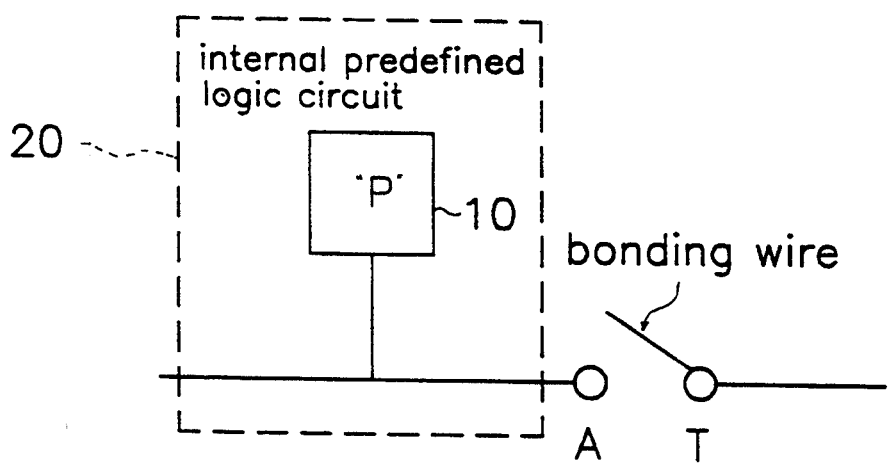
FIGS. 1A and 1B are basic diagrams to describe the present invention, a well-known circuit diagram illustrating a construction of a quasi-tristate input terminal which comprises a pair of chip select terminals, and a logic table showing logic levels of an external input terminal and a predefined logic circuit in accordance with connection/non-connection therebetween.

Referring now to FIG. 1A, reference numeral 10 is an internal predefined logic circuit and reference numeral 20 is a quasi-tristate input terminal having an internal input terminal A. Generally, the internal predefined logic circuit 10 can be equipped with a high resistor.

Also, as shown in FIG. 1A, the quasi-tristate input terminal 20 includes the internal predefined circuit 10 for holding a logic level signal 1 or 0 and a bonding wire (or soldering between a PCB substrate and a package pin) to be connected with an external input terminal T.

In FIG. 1A, when the internal and external input terminals A and T are electrically connected with each other, a logic value held in the internal predefined logic circuit 10 is neglected and a logic value supplied from the quasi-tristate input terminal 20 is determined by a logic value to be applied through the external input terminal T. However, when the input terminals A and T are not connected with each other, the output of the quasi-tristate input terminal 20 is determined by a logic value held in the internal predefined logic circuit 10.

The above-mentioned operation will be described hereinafter with reference to FIG. 1B.

In FIG. 1B, in the case that the input terminals A and T are electrically connected and a logic level of the external input terminal T is 1 (or high level), a logic level of the internal input terminal A becomes 1 (or high level). Also, in the case that the input terminals A and T are not connected and a logic level of the external input terminal T is 1 or 0 (or low level), a logic level of the internal input terminal A becomes the logic level P held in the internal predefined logic circuit without regard to the logic level of the external input terminal T.

Referring to FIG. 2A, a chip select unit 30 comprises a pair of chip select terminals CS and $\overline{CS}$ for alternatively connecting to an external inpu terminal T, a pair of quasi-tristate input terminals 20A and 20B to be respectively connected to the chip select terminals CS and $\overline{CS}$, an inverting gate 31 for inverting a logic level of a connecting point P2 between the chip select terminal $\overline{CS}$ and an internal predefined logic circuit 10B of the quasi-tristate terminal 20B, and an AND gate 32 for receiving signals from the inverting gate 31 and a connecting point P1 between the chip select terminal CS and an internal predefined logic circuit 10A of the quasi-tristate terminal 20A and for supplying a predetermined level signal INT_CS as a logic level of an internal input terminal.

The two internal predefined logic circuits 10A and 10B hold different level signals. For example, when one holds high level signal or 1, the other holds low level signal or 0.

As shown in FIGS. 2A and 2B, in the case that the chip select terminal CS and the external input terminal T are electrically connected with each other and a logic level of the external input terminal T is high, the level signal INT_CS as output of the AND gate 32 becomes high and therefore the corresponding semiconductor chip can be selected. Also, in the case that the chip select terminal CS and the external input terminal T are connected and the logic level of the external input terminal T is low, the level signal INT_CS becomes low and therefore the corresponding semiconductor chip can not be selected.

On the other hand, as shown in FIGS. 3A and 3B, in the case that the chip select terminal $\overline{CS}$ and the external input terminal T are electrically connected with each other and a logic level of the external input terminal T is high, the level signal INT_CS as output of the AND gate 32 becomes low and therefore the corresponding semiconductor chip can not be selected. Also, in the case that the chip select terminal $\overline{CS}$ and the external input terminal T are connected and the logic level of the external input terminal T is low, the level signal INT_CS becomes high and therefore the corresponding semiconductor chip can be selected.

Figure 4:
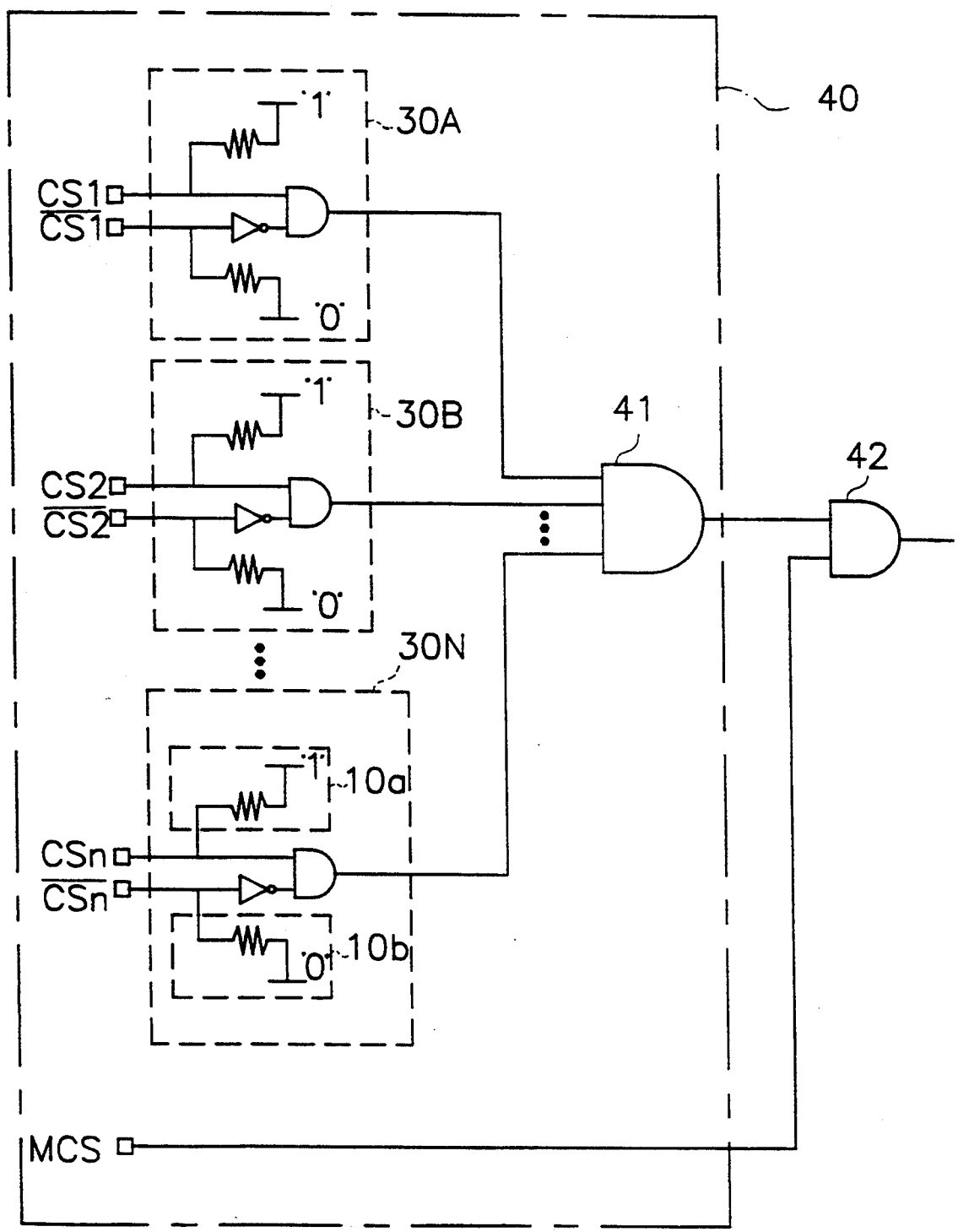
FIG. 4 is a circuit diagram of a decoding means which comprises a plurality of chip select units in accordance with the present invention.

With reference to FIG. 4, a decoding circuit 40 according to the present invention comprises a plurality of chip select units 30A to 30N and an AND gate 41 for receiving signals from the chip select units and for supplying a predetermined signal to select a single semiconductor chip in multiple-chip module. Symbol MCS is as a module select terminal and a signal applied to the terminal MCS along with the output of the AND gate 41 is supplied to an AND gate 42 to provide a module select signal.

Accordingly, the number of the chip select units for comprising a decoding circuit is determined by the number of semiconductor chips in a multiple-chip module.

Hereinafter, packaging of a multiple-chip module 50 will be described with reference to FIGS. 5A and 5B in case that four decoding circuits are respectively equipped in four semiconductor chip selecting circuits 50A to 50D.

Figures 5A, 5B:
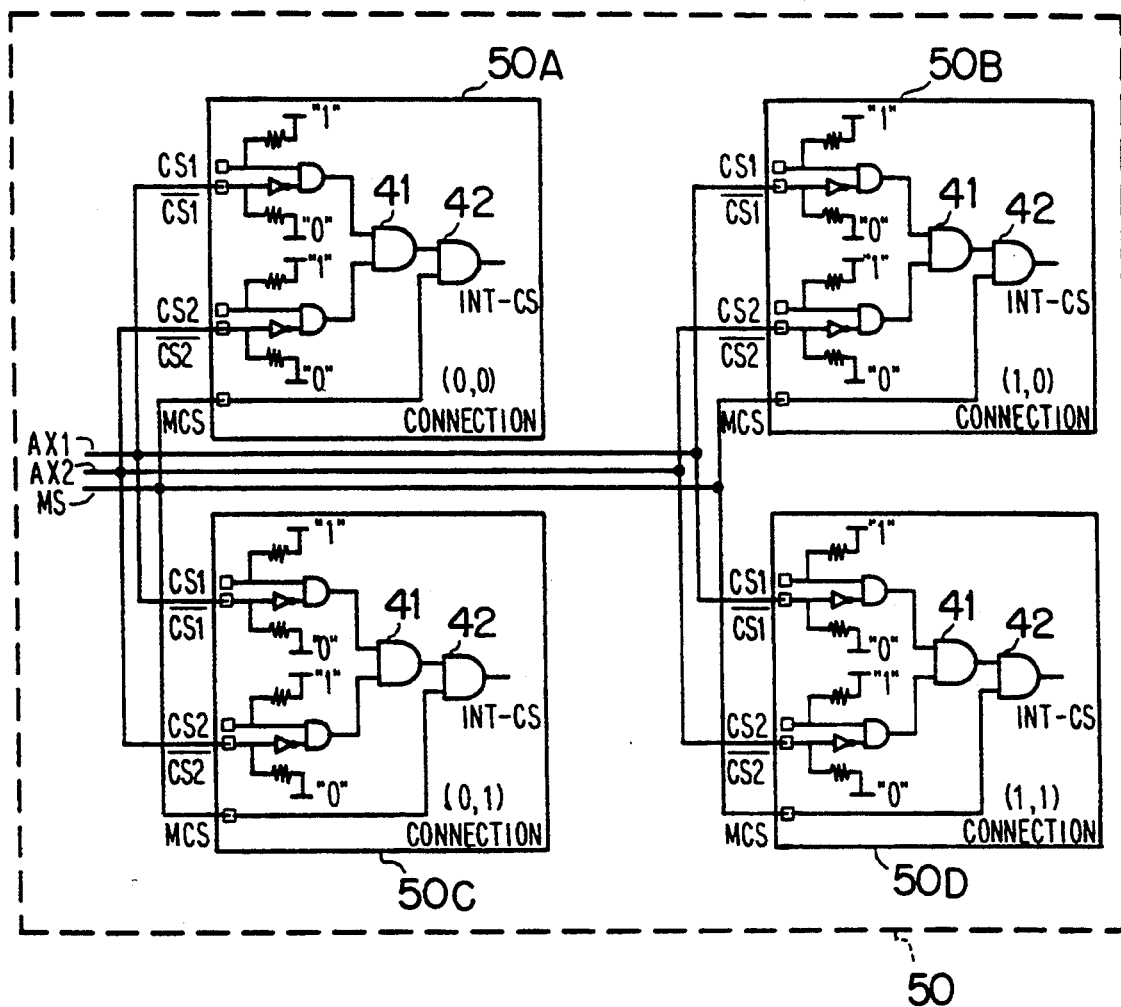
FIGS. 5A and 5B are a circuit diagram illustrating a construction of a semiconductor chip module which comprises a plurality of semiconductor chip selecting circuits in accordance with the present invention and a logic table thereof.

In FIG. 5A, four extended address signals are allotted for the four semiconductor chip selecting circuits 50A to 50D for constituting the multiple-chip module 50, respectively. If address (0,0) is allotted for a first semiconductor chip selecting circuit 50A, address (1,0) for a second semiconductor chip selecting circuit 50B, address (0,1) for a third semiconductor chip selecting circuit 50C, and address (1,1) for a fourth semiconductor chip selecting circuit 50D, by using a logic table as shown in FIG. 5B, two external input terminals of the first semiconductor chip selecting circuit 50A are respectively connected with chip select terminals $\overline{CS1}$ and $\overline{CS2}$, two external input terminals of the second semiconductor chip selecting circuit 50B with chip select terminals CS1 and $\overline{CS2}$, two external input terminals of the third semiconductor chip selecting circuit 50D with chip select terminals $\overline{CS1}$ and CS2, and two external input terminals of the fourth semiconductor chip selecting circuit 50D with chip select terminals CS1 and CS2. Also, all the remaining external input terminals of the selecting circuits 50A to 50D are open-circuited.

A terminal MS serves as a module select terminal and is connected to respective module select terminals MCS of the selecting circuit 50A to 50D. Terminals AX1 and AX2 are provided for the extended address. If the number of semiconductor chips to be selected is M, the terminals corresponding to the number of $\log_2 M$ are required for the extended address.

As described above, the present invention comprises a chip select unit having a pair chip select terminals in which complementary logic values are held and one of the terminals is connected to an external input terminal, so that it is easy to select a semiconductor chip of a multiple-chip module in designing a semiconductor device chip.

Moreover, the present invention is suitable for designing of a semiconductor memory device having the same and repeated structure or a system necessary for voluntary chip select function. According to the present invention, since a simple chip select unit can be equipped in a semiconductor chip, a complicated chip select circuit is not required.

Accordingly, in packaging semiconductor chips in accordance with the present invention, a semiconductor chip module can be miniatured more, processing steps of such semiconductor chip module can be reduced, and input and output terminals of such semiconductor chip module can be reduces in the number so that the invention can improve access time or delay time in the module.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A semiconductor device comprising:
   at least one external address line for providing an external address signal;
   a plurality of chips in which predetermined extended addresses are allocated for each of the chips to select the chips in a multiple-chip module; and
   a plurality of semiconductor chip selectors, for supplying internal chip select signals to select one of said plurality of chips in response to said external addresses and a module select signal; each of said semiconductor chip selectors having:
   at least one decoder for receiving the extended address and outputting a predetermined logic signal, and
   a first AND gate for receiving said module select signal and said logic signal of said at least one decoder and outputting said internal chip select signals, wherein each of said at least one decoder comprises:
   a plurality of chip select units corresponding to the number of the chips in the multiple-chip module; and
   a second AND gate for receiving outputs of said chip select units and outputting said logic signal, wherein each input logic level in each of said plurality of chip selecting units is determined by a level signal of one of said at least one external address lines when said respective chip select unit is connected with one of said external address lines, and each input logic level in said respective chip selecting units is determined by a predefined logic level held in the chip select unit when said respective chip select unit is not connected with the external address line.

2. A semiconductor device having a plurality of chips in which predetermined extended addresses are allocated for each of the chips to select the chips in a multiple-chip module, the device comprising:
   a plurality of semiconductor chip selectors equipped in said semiconductor device, for supplying internal chip select signals to select the chips in response to said external addresses and a module select signal; each of said semiconductor chip selectors having:
   at least one decoder for receiving the extended address and outputting a predetermined logic signal; and
   a first AND gate for receiving said module select signal and said logic signal of said at least one decoder and outputting said internal chip select signals, wherein each of said at least one decoder comprises:
   a plurality of chip select units corresponding to the number of the chips in the multiple-chip module; and
   a second AND gate for receiving outputs of said chip select units and outputting said logic signal, wherein each of said chip select units comprises:
   a pair of chip select terminals for alternatively connecting to an external input terminal;
   a pair of quasi-tristate input terminals to be respectively connected to said chip select terminals;
   an inverting gate for inverting a logic level of a first connecting point between one of the chip select terminals and one of a pair of internal predefined logic circuits in one of the quasi-tristate terminals; and
   a third AND gate for receiving signals from the inverting gate and a second connecting point between the other chip select terminal and the other predefined logic circuit in the other quasi-tristate terminal and for supplying a predetermined level signal from said one of a pair of internal predefined logic circuits as a logic level of an internal input terminal.

3. The semiconductor device according to claim 2, further comprising:
   a module select terminal, coupled to said first AND gate in each of said semiconductor chip selectors for providing said module select signal.

4. The semiconductor device according to claim 2, wherein each of said internal predefined logic circuits comprises a high impedance resistor having one terminal coupled to said quasi-tristate terminal and another terminal coupled to a predetermined logical voltage level.

5. The semiconductor device according to claim 2, wherein each logic level in said respective connecting points is determined by a level signal of the external input terminal when said respective chip select units are connected with the external input terminal, and each logic level in said respective connecting points is determined by a logic level held in the predefined logic circuits when said respective chip select units are not connected with the external input terminal.

* * * * *